United States Patent
Sugawa et al.

(10) Patent No.: US 9,214,489 B2
(45) Date of Patent: Dec. 15, 2015

(54) PHOTODIODE AND METHOD FOR PRODUCING THE SAME, PHOTODIODE ARRAY, SPECTROPHOTOMETER AND SOLID-STATE IMAGING DEVICE

(75) Inventors: Shigetoshi Sugawa, Sendai (JP); Rihito Kuroda, Sendai (JP)

(73) Assignees: National University Corporation Tohoku University, Miyagi (JP); SHIMADZU CORPORATION, Kyoto (JP)

( * ) Notice: Subject to any disclaimer, the term of this patent is extended or adjusted under 35 U.S.C. 154(b) by 64 days.

(21) Appl. No.: 14/124,129

(22) PCT Filed: Jun. 4, 2012

(86) PCT No.: PCT/JP2012/064394
§ 371 (c)(1),
(2), (4) Date: Dec. 5, 2013

(87) PCT Pub. No.: WO2012/169462
PCT Pub. Date: Dec. 13, 2012

(65) Prior Publication Data
US 2014/0097510 A1    Apr. 10, 2014

(30) Foreign Application Priority Data

Jun. 7, 2011   (JP) .................................. 2011-127273

(51) Int. Cl.
*H01L 31/062*   (2012.01)
*H01L 27/146*   (2006.01)
*H01L 31/06*   (2012.01)
(Continued)

(52) U.S. Cl.
CPC ......... *H01L 27/14643* (2013.01); *G01J 3/2803* (2013.01); *H01L 27/14601* (2013.01); *H01L 27/14609* (2013.01); *H01L 31/06* (2013.01); *H01L 31/18* (2013.01); *Y02E 10/50* (2013.01)

(58) Field of Classification Search
CPC .................. H01L 27/14601; H01L 27/14643; H01L 27/14609; H01L 31/18; H01L 31/06
USPC ............................................ 257/292; 438/57
See application file for complete search history.

(56) References Cited

U.S. PATENT DOCUMENTS

2004/0207016 A1   10/2004   Patel et al.
2004/0240822 A1   12/2004   Patel et al.
2005/0236619 A1   10/2005   Patel et al.
(Continued)

FOREIGN PATENT DOCUMENTS

CA   2 520 972 A1   11/2004
CN   1784781 A   6/2006
(Continued)

OTHER PUBLICATIONS

International Search Report of PCT/JP2012/064394 dated Sep. 4, 2012.
(Continued)

*Primary Examiner* — Trung Q Dang
(74) *Attorney, Agent, or Firm* — Sughrue Mion, PLLC

(57) ABSTRACT

Provided is a photodiode having a high-concentration layer on its surface, in which the high-concentration layer is formed so that the thickness of a non-depleted region is larger than the roughness of an interface between silicon and an insulator layer, and is smaller than a penetration depth of ultraviolet light.

13 Claims, 10 Drawing Sheets

(51) Int. Cl.
  *H01L 31/18* (2006.01)
  *G01J 3/28* (2006.01)

(56) References Cited

U.S. PATENT DOCUMENTS

| | | | |
|---|---|---|---|
| 2007/0000862 A1 | 1/2007 | Patel et al. | |
| 2009/0239354 A1* | 9/2009 | Suzawa et al. | 438/458 |
| 2009/0303371 A1* | 12/2009 | Watanabe et al. | 348/311 |
| 2011/0140246 A1* | 6/2011 | Hoenk et al. | 257/655 |

FOREIGN PATENT DOCUMENTS

| | | |
|---|---|---|
| JP | 3-4231 U | 1/1991 |
| JP | 03-091967 A | 4/1991 |
| JP | 2002-255700 A | 9/2002 |
| JP | 2003-139611 A | 5/2003 |
| JP | 2005-175316 A | 6/2005 |
| JP | 2006-525677 A | 11/2006 |
| KR | 10-2006-0003046 A | 1/2006 |
| WO | 2004/088396 A2 | 10/2004 |
| WO | 2004/095112 A2 | 11/2004 |

OTHER PUBLICATIONS

Japanese Office Action issued Oct. 7, 2014 in Japanese Patent Application No. 2013-519484.
Extended European Search Report issued Sep. 22, 2014 in European Patent Application No. 12796420.3.
Japanese Office Action issued Jul. 8, 2014 in Japanese Patent Application No. 2013-519484.

* cited by examiner

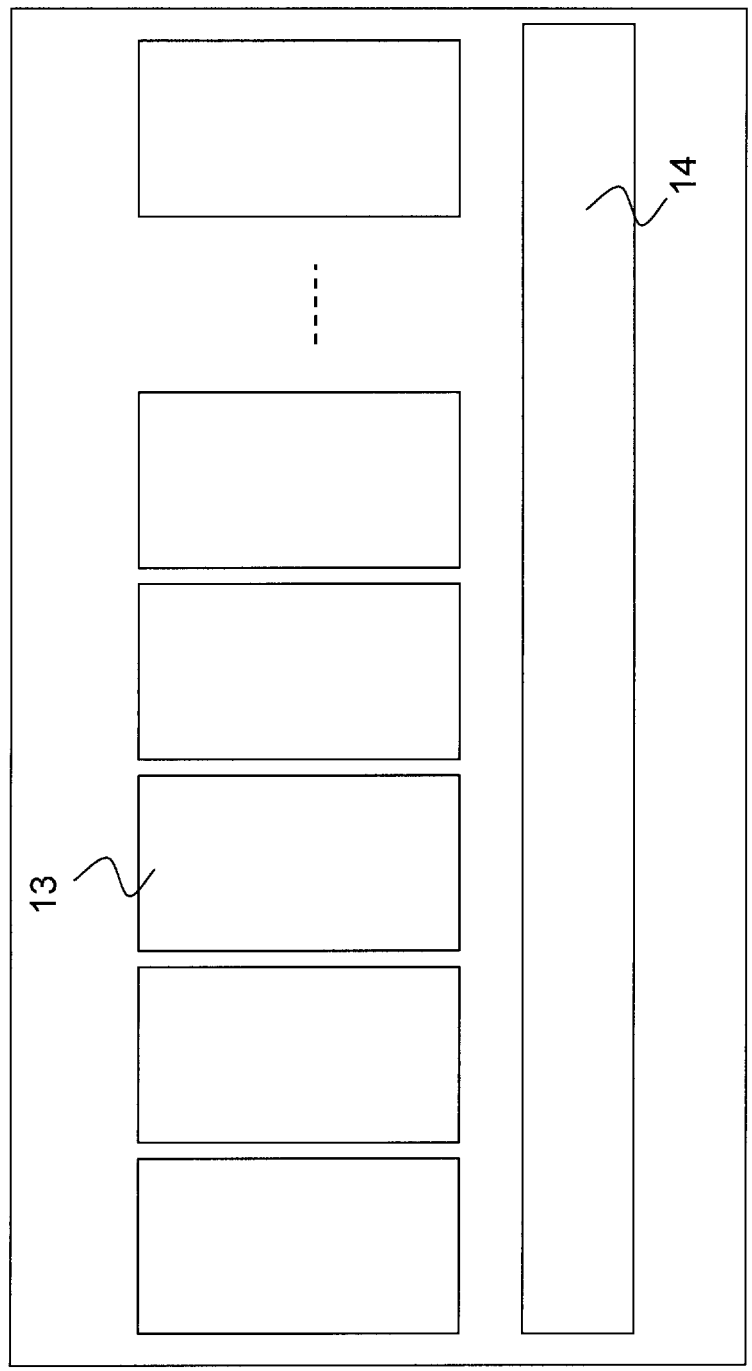

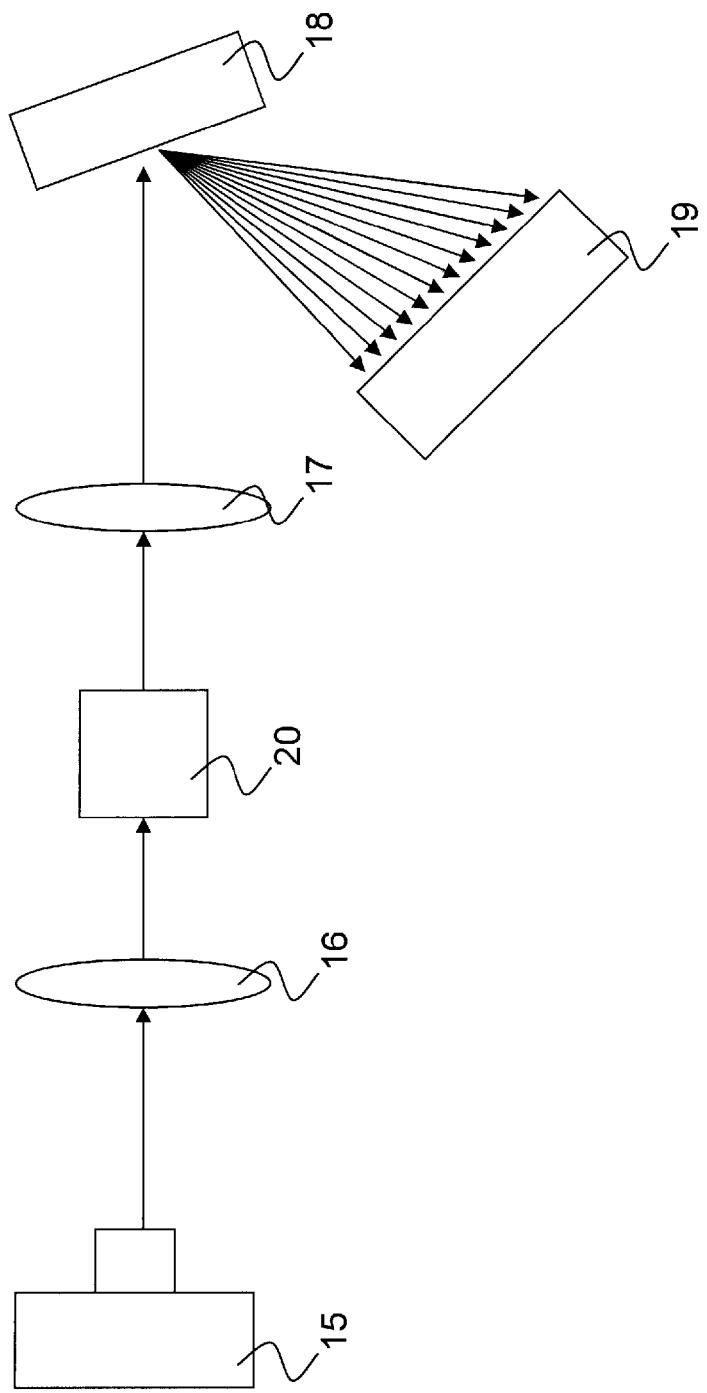

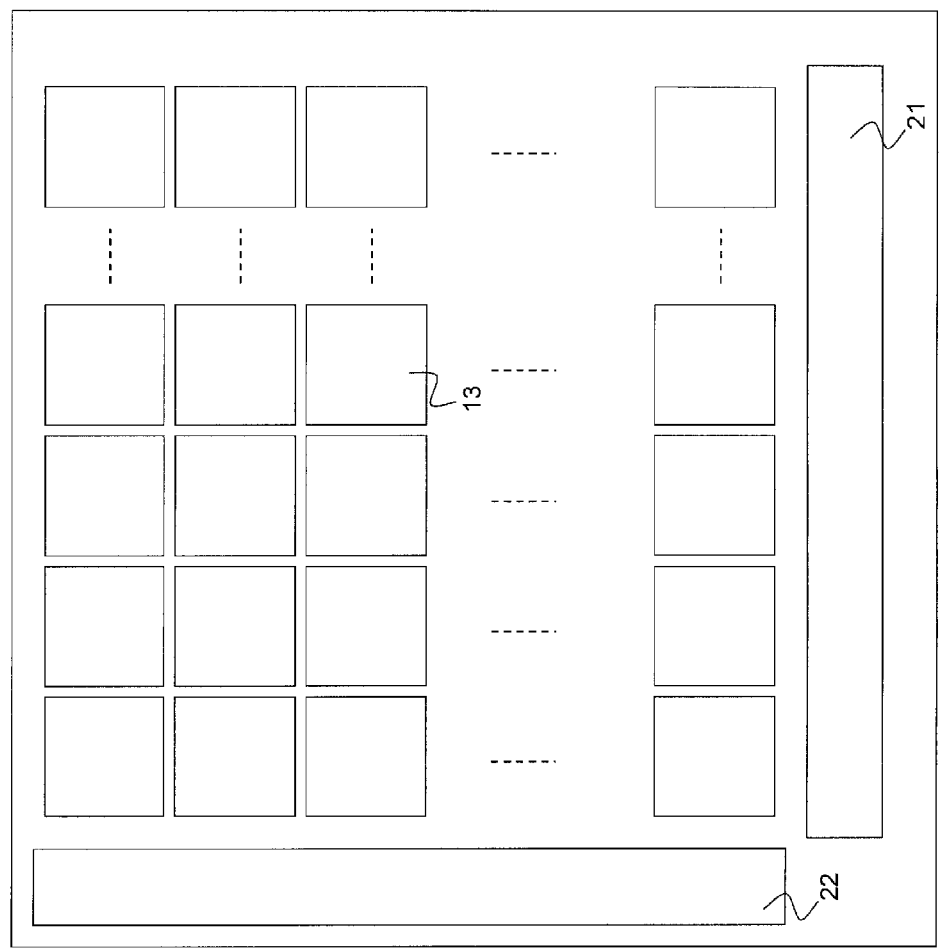

PHOTODIODE AND METHOD FOR PRODUCING THE SAME, PHOTODIODE ARRAY, SPECTROPHOTOMETER AND SOLID-STATE IMAGING DEVICE

CROSS REFERENCE TO RELATED APPLICATIONS

This is a National Stage of International Application No. PCT/JP2012/064394 filed Jun. 4, 2012, claiming priority based on Japanese Patent Application No. 2011-127273 filed Jun. 7, 2011, the contents of all of which are incorporated herein by reference in their entirety.

TECHNICAL FIELD

The present invention relates to a photodiode and a photodiode array for receiving ultraviolet light in addition to the visible and near-infrared light, a method for producing them, as well as a spectrophotometer, a solid-state imaging device, an image sensor and other devices using them.

BACKGROUND ART

FIG. 1 shows a partial sectional view of a photodiode for a comparative explanation of the present invention. The illustrated photodiode has a p-type region 1 for accumulating photocharges in a semiconductor layer made of silicon (not shown), an insulator layer 5 being in contact with the semiconductor layer, and an n$^+$-type region 2 formed in the section from the interface between the semiconductor layer and the insulator layer 5 to the p-type region. The n$^+$-type region 2 has a region which is in contact with the p-type region 1 and which forms a depleted layer, and a non-depleted region 9 which is in contact with the insulator layer 5. The interface between the non-depleted region 9 and the insulator layer 5 has roughness 11. The roughness 11 of the interface between the semiconductor layer and the insulator layer in a region having a length of 1 μm in the direction parallel to the interface have a height of approximately 1 nm, as can be confirmed in FIG. 3 which shows an atomic force microscope image of the interface and a profile of the roughness. The thickness 10 of the non-depleted region 9 of the n$^+$-type region 2 is made to be considerably large, e.g. 100 nm, so as to suppress a dark current resulting from a carrier-producing current due to the interface state.

As in the case of the photodiode shown in FIG. 1, if the thickness 10 of the non-depleted region 9 of the n$^+$-type region is 200 nm and hence greater than the penetration depth 12 of the ultraviolet light, the electric field for the drift transport of photocharges toward the p-type region 1 in the non-depleted region 9 of the n$^+$-type region 2 is insufficient for efficiently transporting the photocharges generated by the ultraviolet light to the n-type region, and the photocharges annihilate due to recombination. Thus, sensitivity to the ultraviolet light is low.

On the other hand, in the case of the photodiode shown in FIG. 2, where the thickness 10 of the non-depleted region 9 of the n$^+$-type region 2 is on average smaller than the penetration depth 12 of the ultraviolet light, a section in which the thickness is smaller than the roughness 11 of the interface locally occurs. In such a local section where the thickness 10 of the non-depleted region 9 of the n$^+$-type region 2 is smaller than the roughness 11 of the interface, the generation and recombination of electric charges due to the interface state frequently occurs, producing a high dark current. Furthermore, the annihilation of photocharges due to the recombination particularly lowers the sensitivity to the ultraviolet light in the wavelength range of 200-320 nm, which has a short penetration depth, among the light in the wavelength range of 200-1100 nm.

Furthermore, due to the interface state or a local depletion of the n$^+$-type region 2 caused by the fixed charges in the insulator layer 5 resulting from a long-term irradiation with the ultraviolet light, the dark current increases and the sensitivity to the ultra violet light fluctuates. Thus, the dark current and the sensitivity have been unstable against irradiation with the ultraviolet light.

SUMMARY OF THE INVENTION

Problem to be Solved by the Invention

The present invention has been developed in view of the previously described situation. Its objective is to provide a photodiode and a photodiode array capable of detecting light in the ultraviolet region with high sensitivity, a method for producing them, as well as a spectrophotometer and a solid-stage imaging device using a photodiode.

Means for Solving the Problem

To achieve the aforementioned objective, a photodiode according to the present invention includes a first-conduction-type region in a semiconductor layer made of silicon, a insulator layer being in contact with the semiconductor layer, and a second-conduction-type region located between the first-conduction-type layer and an interface between the semiconductor layer and the insulator layer, the second-conduction-type region having a polarity opposite to the first-conduction-type region, wherein the thickness of a non-depleted region of the second-conduction-type region is larger than the roughness of the interface between the semiconductor layer and the insulator layer in a region having a length of 1 μm in the direction parallel to the interface, and is smaller than a penetration depth of ultraviolet light at which the intensity of the ultraviolet light in a wavelength range of 200-320 nm entering the semiconductor layer is equal to 1/e times the intensity of the same ultraviolet light at the outermost surface of the silicon.

The photodiode according to the present invention may further include a third-conduction-type region being in contact with the first-conduction-type region on the opposite side of the first-conduction-type region from the second-conduction-type region, the third-conduction-type region having a polarity opposite to the first-conduction-type region.

In a preferable mode of the photodiode according to the present invention, the roughness of the interface corresponds to the minimal level difference of the atoms in the plane orientation of the semiconductor layer.

In one mode of the photodiode according to the present invention, the main impurity in the second-conduction-type region is As, P or Sb.

In the photodiode according to the present invention, the main impurity in the second-conduction-type region may be either B or Ga.

To achieve the previously described objective, a method for producing a photodiode according to the present invention includes the steps of forming a first-conduction-type region in a semiconductor layer made of silicon, forming a insulator region being in contact with the semiconductor layer, and forming a second-conduction-type region located between the first-conduction-type layer and an interface between the semiconductor layer and the insulator layer, the second-conduction-type region having a polarity opposite to the first-conduction-type region, wherein a smoothing process for making the roughness of the surface of the semiconductor layer correspond to the minimal level difference of the atoms in the plane orientation of the semiconductor layer is performed at least one time in the production process. The smoothing process may include a process of removing a natural oxide film on the surface of the semiconductor layer and then heat-treating the semiconductor layer at 800° C. or higher temperatures in an atmosphere of Ar, $H_2$ or Ar/$H_2$.

In the method for producing a photodiode according to the present invention, the interface between the semiconductor layer and the insulator layer is created by forming the insulator layer by an oxidizing, oxynitriding or nitriding method in which the created interface has roughness that corresponds to the minimal level difference of the atoms in the plane orientation of the semiconductor layer if the roughness on the surface of the semiconductor layer before the formation of the insulator layer corresponds to the minimal level difference of the atoms in the plane orientation of the semiconductor layer. The oxidizing, oxynitriding or nitriding method may include the step of oxidizing, oxynitriding or nitriding the surface of the semiconductor layer by an isotropic process whose film-forming rate is independent of the difference in the plane orientation of the semiconductor layer. For example, it may be an oxidizing, oxynitriding or nitriding method using an oxygen radical and/or nitrogen radical.

To achieve the previously described objective, a photodiode array according to the present invention includes a photodiode having: a first-conduction-type region in a semiconductor layer made of silicon; a insulator layer being in contact with the semiconductor layer; and a second-conduction-type region located between the first-conduction-type layer and an interface between the semiconductor layer and the insulator layer, the second-conduction-type region having a polarity opposite to the first-conduction-type region, wherein the thickness of a non-depleted region of the second-conduction-type region is larger than the roughness of the interface between the semiconductor layer and the insulator layer in a region having a length of 1 μm in the direction parallel to the interface, and is smaller than a penetration depth of ultraviolet light at which the intensity of the ultraviolet light in a wavelength range of 200-320 nm entering the semiconductor layer is equal to 1/e times the intensity of the same ultraviolet light at the outermost surface of the silicon. The photodiode may further include a third-conduction-type region being in contact with the first-conduction-type region on the opposite side of the first-conduction-type region from the second-conduction-type region, the third-conduction-type region having a polarity opposite to the first-conduction-type region. The roughness of the interface should preferably correspond to the minimal level difference of the atoms in the plane orientation of the semiconductor layer. In this case, the main impurity in the second-conduction-type region of the photodiode may preferably be As, P or Sb, or the main impurity may preferably contain either B or Ga.

Furthermore, the photodiode array is configured to receive a component of light in a wavelength range of 200-1100 nm, including: a plurality of pixels integrated in the form of an array, with each pixel having the aforementioned photodiode and a transfer transistor for transferring photocharges generated by and accumulated in the photodiode; and a scan circuit for sequentially selecting and reading a signal from each pixel.

To achieve the previously described objective, a spectrophotometer according to the present invention has a photodiode array including photodiodes, each photodiode having: a first-conduction-type region in a semiconductor layer made of silicon; a insulator layer being in contact with the semiconductor layer; and a second-conduction-type region located between the first-conduction-type layer and an interface between the semiconductor layer and the insulator layer, the second-conduction-type region having a polarity opposite to the first-conduction-type region, wherein the thickness of a non-depleted region of the second-conduction-type region is larger than the roughness of the interface between the semiconductor layer and the first insulator layer in a region having a length of 1μm in the direction parallel to the interface, and is smaller than a penetration depth of ultraviolet light at which the intensity of the ultraviolet light in a wavelength range of 200-320 nm entering the semiconductor layer is equal to 1/e times the intensity of the same ultraviolet light at the outermost surface of the silicon. In this case, the photodiode may further include a third-conduction-type region being in contact with the first-conduction-type region on the opposite side of the first-conduction-type region from the second-conduction-type region, the third-conduction-type region having a polarity opposite to the first-conduction-type region. The roughness of the interface should preferably correspond to the minimal level difference of the atoms in the plane orientation of the semiconductor layer. The main impurity in the second-conduction-type region of the photodiode may preferably be As, P or Sb, or the main impurity may preferably contain either B or Ga. The spectrophotometer according to the present invention is designed for a spectral measurement of light in a wavelength range of 200-1100 nm, including: a diode array having a plurality of pixels integrated in the form of an array, with each pixel having the aforementioned photodiode and a transfer transistor for transferring photocharges generated by and accumulated in the photodiode; a light source for generating light in a wavelength range of 200-1100 nm; a first lens for focusing the light generated by the light source on a measurement object; a second lens for focusing the light coming from the measurement object; and either a diffraction grating or a prism.

To achieve the previously described objective, a solid-state imaging system according to the present invention includes a photodiode having: a first-conduction-type region in a semiconductor layer made of silicon; a insulator layer being in contact with the semiconductor layer; and a second-conduction-type region located between the first-conduction-type layer and an interface between the semiconductor layer and the insulator layer, the second-conduction-type region having a polarity opposite to the first-conduction-type region, wherein the thickness of a non-depleted region of the second-conduction-type region is larger than the roughness of the interface between the semiconductor layer and the insulator layer in a region having a length of 1 μm in the direction parallel to the interface, and is smaller than a penetration depth of ultraviolet light at which the intensity of the ultraviolet light in a wavelength range of 200-320 nm entering the semiconductor layer is equal to 1e times the intensity of the same ultraviolet light at the outermost surface of the silicon. The photodiode may further include a third-conduction-type region being in contact with the first-conduction-type region on the opposite side of the first-conduction-type region from the second-conduction-type region, the third-conduction-type region having a polarity opposite to the first-conduction-type region. The roughness of the interface should preferably correspond to the minimal level difference of the atoms in the plane orientation of the semiconductor layer. The main impurity in the second-conduction-type region of each photodiode constituting the solid-state imaging system may preferably be As, P or Sb, or the main impurity may preferably be either B or Ga.

The solid-state imaging system according to the present invention is configured to receive light in a wavelength range of 200-1100 nm and to capture an image, wherein a plurality of pixels are integrated in the form of a two-dimensional array, with each pixel having the aforementioned photodiode and a transfer transistor for transferring photocharges generated by and accumulated in the photodiode.

To achieve the previously described objective, a photodiode array according to the present invention is configured to receive a component of light in a wavelength range of 200-1100 nm, with a plurality of pixels integrated in the form of an array, each pixel having the aforementioned photodiode, and the photodiode array including:

a scan circuit or a charge-signal transfer circuit for sequentially selecting and reading a signal from each pixel.

To achieve the previously described objective, a spectrophotometer according to the present invention is configured to perform a spectral measurement of at least a portion of light in a wavelength range of 200-1100 nm, including: the aforementioned photodiode array; a light source for generating a portion of light in a wavelength range of 200-1100 nm; a first lens for focusing the light generated by the light source on a measurement object; a second lens for focusing the light coming from the measurement object; and either a diffraction grating or a prism.

To achieve the previously described objective, a solid-state imaging system according to the present invention is configured to receive light in a wavelength range of 200-1100 nm and to capture an image, with a plurality of pixels integrated in the form of a two-dimensional array, each pixel having the aforementioned photodiode, and the solid-state imaging system including:

a scan circuit or a charge-signal transfer circuit for sequentially selecting and reading a signal from each pixel.

Effect of the Invention

According to the present invention, the thickness of the non-depleted region in one conduction-type region on the surface of a buried photodiode is larger than the roughness of the interface between the semiconductor layer and the insulator layer in a region having a length of 1 μm in the direction parallel to the interface, and is smaller than the penetration depth of ultraviolet light at which the intensity of the ultraviolet light in a wavelength range of 200-320 nm entering the semiconductor layer is equal to 1/e times the intensity of the same ultraviolet light at the outermost surface of the silicon. As a result, while the frequency of the generation and recombination of electric charges due to the interface state is suppressed as well as the dark current is maintained at low levels, an electric field for the drift transport of photocharges is also created in a section thinner than the penetration depth of the ultraviolet, so that the electric charges generated by the light in the ultraviolet region can be efficiently transferred to the charge-accumulating layer and a high level of sensitivity to the ultraviolet light can be achieved.

Furthermore, even if an interface state is created or electric charges in the insulator layer are increased due to a long-term irradiation with ultraviolet light, the local depletion of one conduction-type region on the surface does not occur. Thus, the fluctuation in the dark current or the sensitivity due to the irradiation with the ultraviolet light is suppressed.

BRIEF DESCRIPTION OF THE DRAWINGS

FIG. 8 is a schematic plan view of a photodiode array according to the third embodiment of the present invention.

FIG. 9 is a schematic diagram of a spectrophotometer according to the fourth embodiment of the present invention.

FIG. 10 is a schematic plan view of a solid-state image sensor according to the fifth embodiment of the present invention.

BEST MODE FOR CARRYING OUT THE INVENTION

Embodiments of the solid-state imaging system of the present invention are hereinafter described with reference to the attached drawings.

First Embodiment

Figure 1:
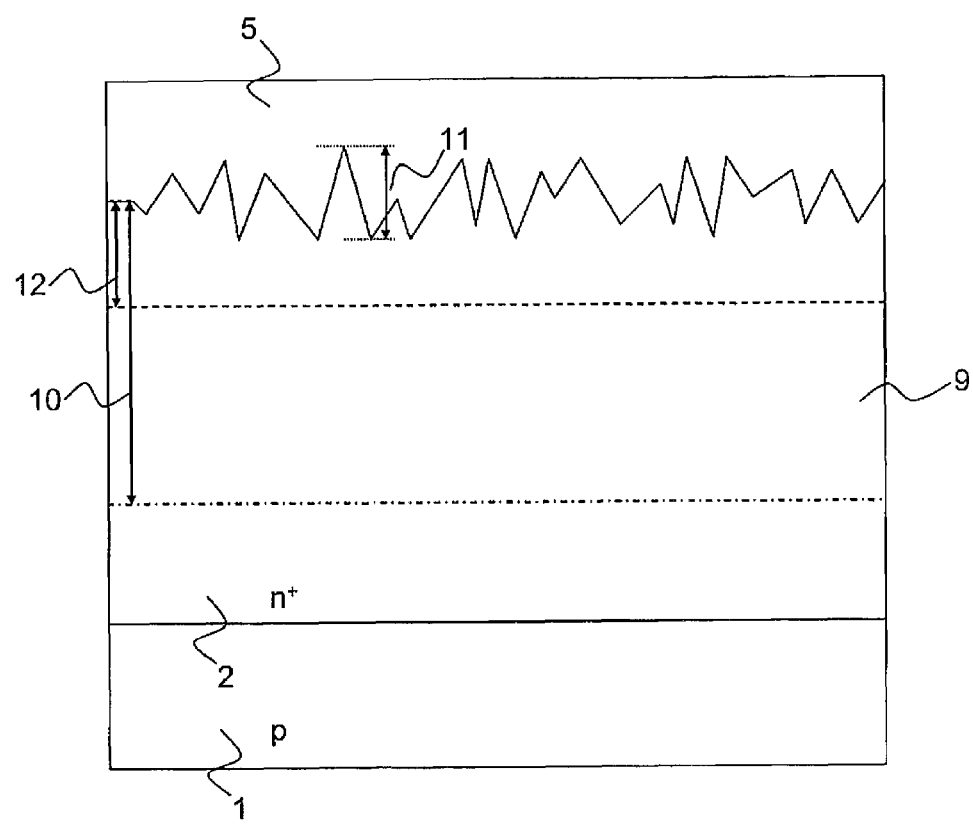
FIG. 1 is a sectional view of a photodiode structure having a low sensitivity to ultraviolet light in which the thickness 10 of the non-depleted region 9 of a region 2 is larger than the penetration depth of the ultraviolet light.
Figure 2:
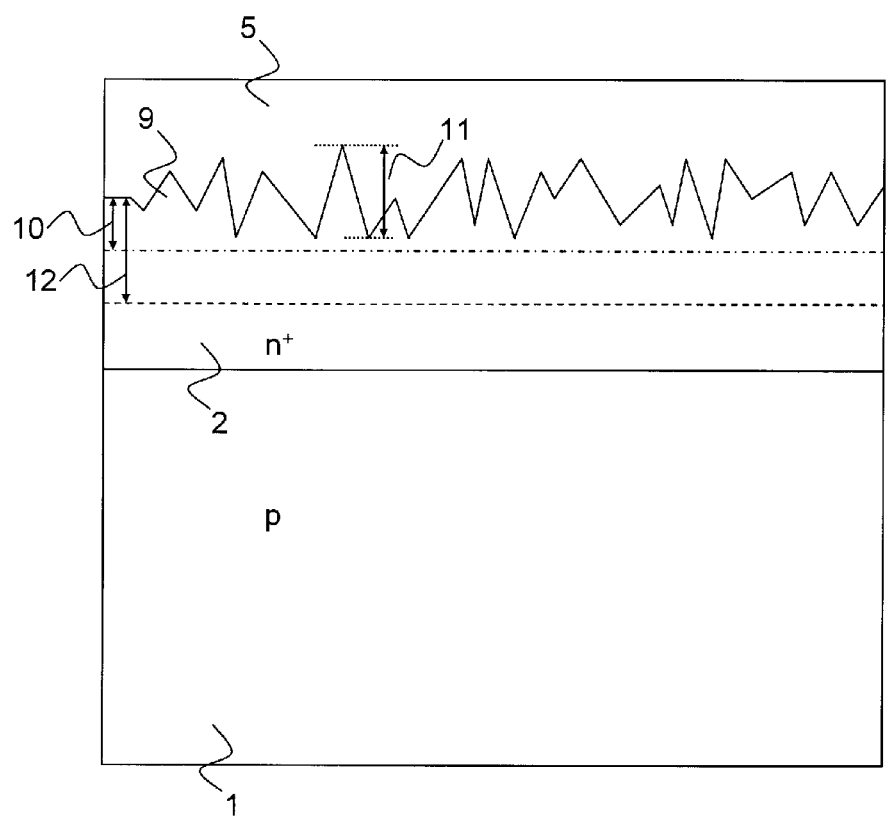
FIG. 2 is a sectional view of a photodiode structure having a low sensitivity to ultraviolet light in which the thickness 10 of the non-depleted region 9 of a region 2 is on average smaller than the penetration depth of the ultraviolet light, and in which the non-depleted region is has a local section having a thickness smaller than the roughness of an interface between the silicon and an insulator layer 5.
Figure 3:
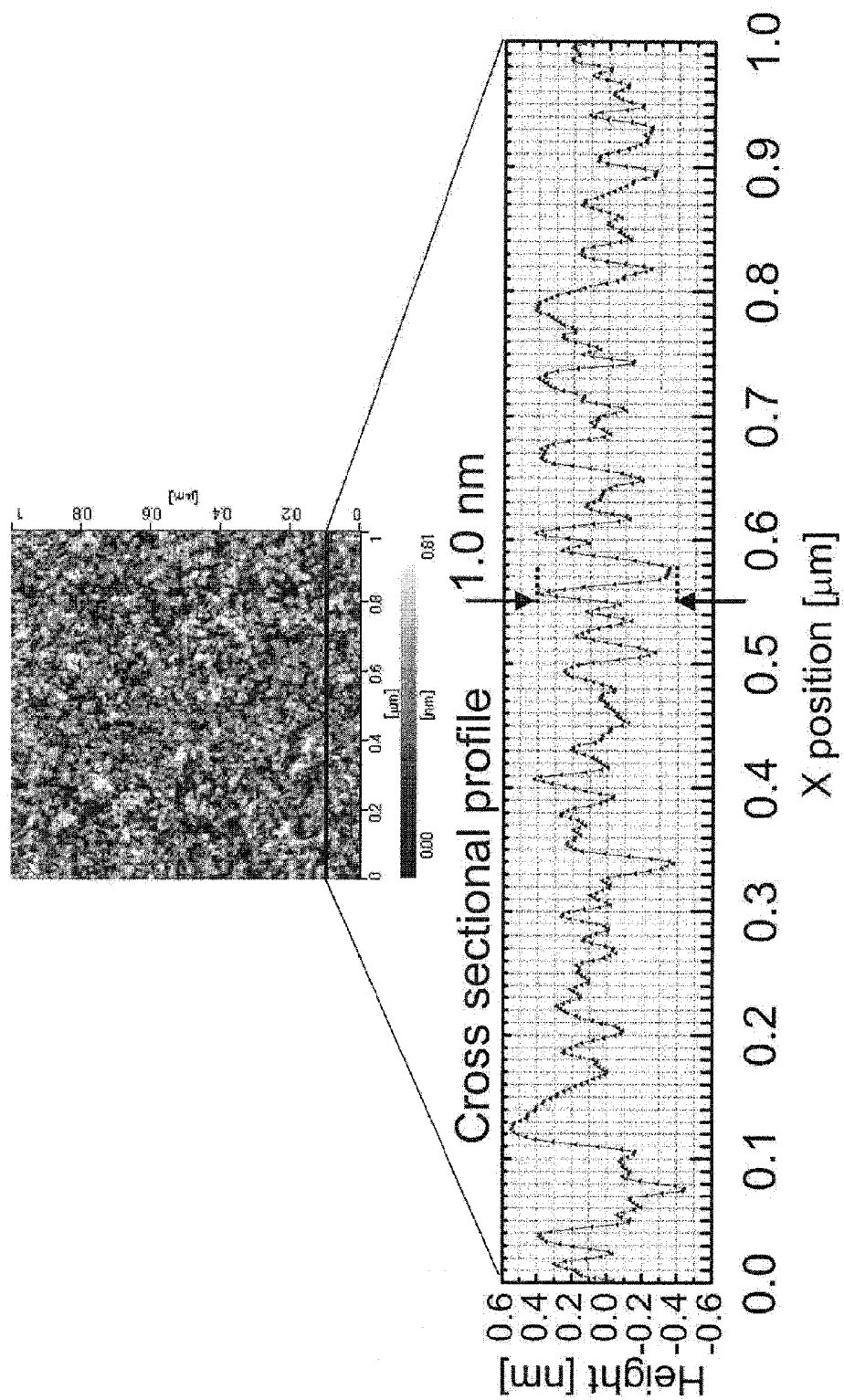
FIG. 3 is an atomic force microscope image of an interface between the semiconductor layer and the insulator layer in the photodiode structure shown in FIG. 1 or 2, accompanied by an roughness profile of the interface, where the roughness of the interface between the semiconductor layer and the insulator layer in a region having a length of 1 μm in the direction parallel to the interface has a height of approximately 1 nm.
Figure 4:
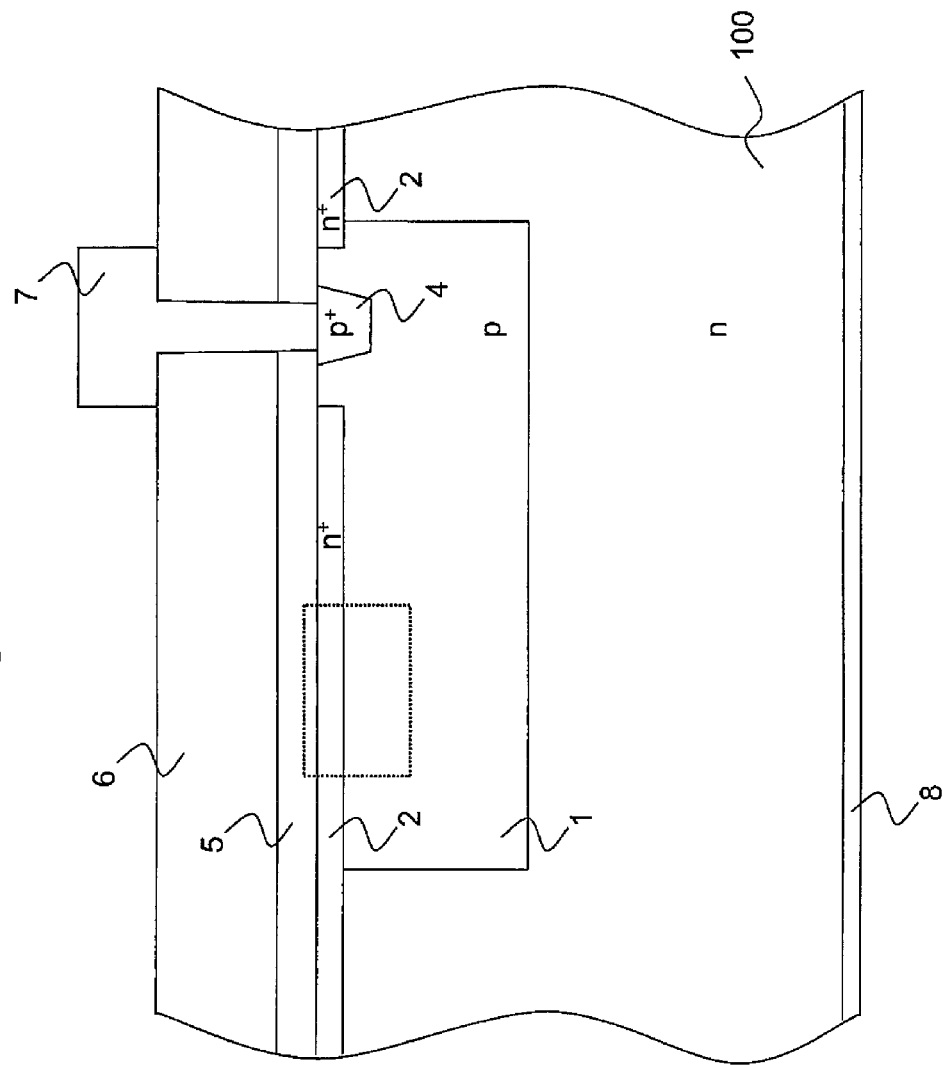
FIG. 4 is a sectional view of a photodiode according to the first embodiment of the present invention.
Figure 6:
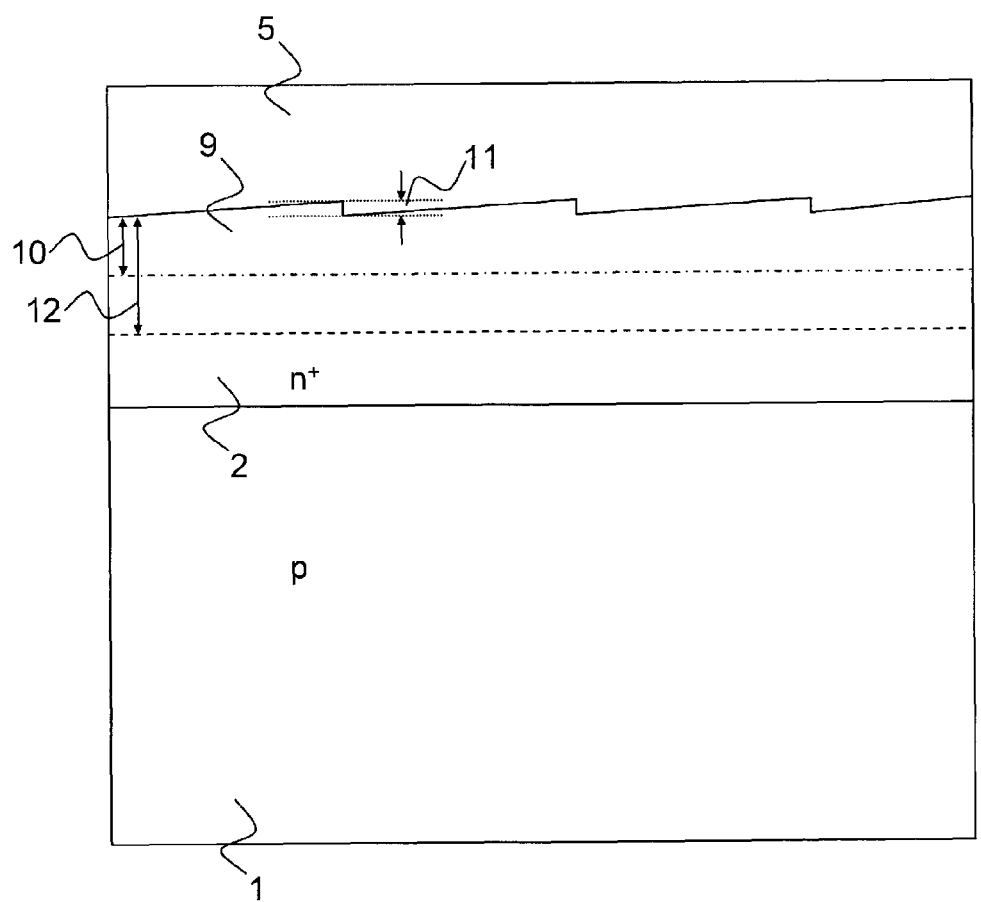
FIG. 6 is an enlarged view of a section surrounded by the dotted line in FIGS. 4 and 5 of the present invention.
Figure 7:
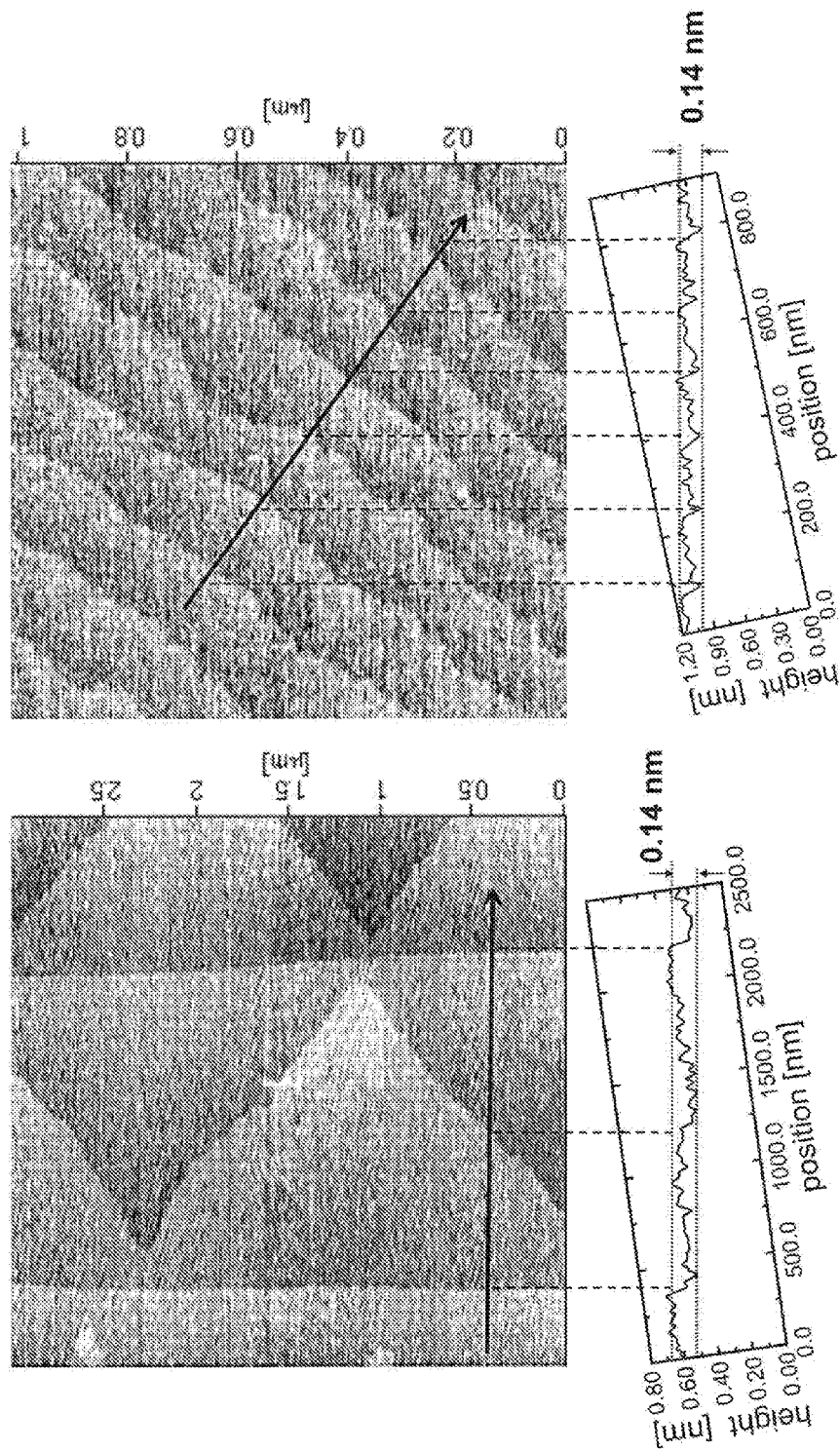
FIG. 7 is an atomic force microscope image and an roughness profile of an interface between a semiconductor layer and an insulator layer according to the first and second embodiments of the present invention.

FIG. 4 shows a sectional view of a photodiode according to the first embodiment of the present invention, FIG. 6 is an enlarged view of a section of the sectional view of the photodiode surrounded by the dotted line in FIG. 4, and FIG. 7 is an atomic force microscope image and a roughness profile of the interface between the semiconductor layer and the insulator layer 5.

In the present embodiment, a silicon wafer 100 with the (100) oriented plane produced by the Czochralski (Cz) method is used. This silicon wafer is an n-type wafer, with an impurity concentration of $1 \times 10^{15}$ cm$^{-3}$. A p-type silicon wafer may also be used. The surface region of the silicon wafer may be formed by epitaxial growth. The plane orientation of the silicon wafer is not limited to the (100) oriented plane.

Preferably, a surface-smoothing process for making the roughness on the surface of the silicon wafer correspond to the minimal level difference on the (100) oriented plane of the silicon is initially performed. In the present embodiment, the silicon surface is smoothed by removing a natural oxide film from the surface by using a chemical solution of diluted hydrofluoric acid and then performing a heat treatment in a high-cleanness argon atmosphere at atmospheric pressure. The heat treatment is performed at 900° C. for one hour. H$_2$ or Ar/H$_2$ may also be used as the atmosphere in the heat treatment for the smoothing process. The pressure in the heat treatment may be lower than the atmospheric pressure. By this smoothing process, the surface of the silicon wafer 100 is smoothed on the atomic level.

A portion of the smoothing process may be performed by using the method of forming an oxide film with a thickness of 100 nm or larger by wet oxidation at 1000° C. or higher temperatures and then peeling off the formed oxide film.

A portion of the smoothing process may also be performed by using the method of immersing the silicon wafer in a chemical solution of diluted hydrofluoric acid under a light-blocked environment with the concentration of dissolved oxygen in the chemical solution being 1 ppb or lower.

Subsequently, an insulator layer 5 is formed. Preferably, this layer is created by an oxidizing, oxynitriding or nitriding method in which the created interface between the silicon and the insulator layer 5 has roughness that corresponds to the minimal level difference of the atoms in the plane orientation of the silicon if the roughness of the silicon before the formation of the insulator layer 5 corresponds to the minimal level difference of the atoms in the plane orientation of the silicon. In the present embodiment, an oxide film is formed by an oxidizing method using a microwave-excited high-density plasma system. The film thickness of the formed insulator layer 5 in the present embodiment is 7 nm. Another possible method is an isotropic oxidation method using an oxygen radical as the oxidizing species in which the film-forming rate is independent of the plane orientation of the silicon. It has been confirmed that, in the case where the oxygen radical is used to form the insulator layer 5, the surface of the silicon wafer 100 which has been smoothed on the atomic level is completely maintained, and the interface between the silicon wafer 100 and the insulator layer 5 is also as smooth as the atomic level.

After that, the p-type region 1 shown in FIG. 4 is formed. In the present embodiment, $B^+$ ions are injected from above the insulator layer 5, after which a heat treatment at 1000° C. is performed to activate the impurity. The injection conditions of the $B^+$ ions are an energy of 15 keV and a dose of $3.4\times10^{12}$ cm$^{-2}$.

Next, the $n^+$-type region 2 is formed. In the present embodiment, this is achieved by injecting $As^+$ ions with an injection energy of 10 keV and at a dose of $3.4\times10^{13}$ cm$^{-2}$. As shown in FIG. 6, the thickness 10 of the non-depleted region 9 in the created $n^+$-type region 2 is larger than the roughness 11 of the interface and smaller than the penetration depth 12 of ultraviolet light. It should be noted that the penetration depth 12 of the ultraviolet light is determined by the distance traveled by an incident light until its intensity is decreased to 1/e times the original level. Therefore, the thickness 10 of the non-depleted region 9 in the $n^+$-type region 2 is smaller than the thickness at which the intensity of the incident ultraviolet light in a wavelength range of 200-320 nm is equal to 1/e times the intensity of light at the outermost surface of the silicon wafer 100.

In addition to reducing the thickness of the $n^+$-type region 2 in the previously described manner, it is preferable to distribute the main impurity in the $n^+$-type region 2 in such a manner that its concentration profile is highest at the interface and gradually decreases as it goes deeper in the silicon. This can be achieved by regulating the thickness of the insulator layer 5 and the injection energy in the ion-injection process for creating the $n^+$-type region 2 so that the region where the concentration profile of the main impurity in the $n^+$-type region 2 after the ion injection is maximized is formed within the insulator layer 5. In the present embodiment, the thickness of the n+-type region 2 is 25 nm.

Even if the region where the concentration profile of the main impurity in the $n^+$-type region 2 after the ion injection is maximized is located within the silicon wafer 100, the region where the concentration profile of the impurity is maximized can eventually be formed within the insulator layer 5 by further oxidizing the silicon after the ion injection.

The ion species to be injected in the previously described processes may be $As^+$, $P^+$, $Ab^+$, a cluster ion of one of these elements, or a fluoride ion or hydride ion of one of these elements, so that As, P or Sb will be the main impurity of the $n^+$-type region 2.

Subsequently, as shown in FIG. 4, an insulation film layer 6 is formed on the insulator layer 5. In the present embodiment, the insulation film layer 6 is a 200-nm oxide film layer formed by chemical vapor deposition. In addition to the oxide film layer, a material having a broad bandgap, such as $Al_2O_3$, $Si_3N_4$, $MgF_2$, MgO or $Y_2O_3$, may be used for the insulation film layer 6 to improve optical transmittance. A laminate structure consisting of any combination of these materials may also be used.

After that, a portion of the insulation film layer 6 and the insulator layer 5 is etched so as to bore a contact hole.

Subsequently, a $p^+$-type region 4 is created in the etched region. In the present embodiment, this is achieved by injecting ions with an injection energy of 10 keV and at a dose of $2\times10^{15}$ cm$^{-2}$, using $BF_2^+$ as the injection species.

Then, the injected impurity is activated. In the present embodiment, this is achieved by a lamp-type heating treatment with the temperature reaching up to 950° C. In order to prevent the impurity concentration profile created by the ion injection from changing due to the diffusion of the impurity which occurs during the heat treatment, this heat treatment should preferably be performed for a short period of time and at a maximum temperature at which the defect density will be suppressed to low levels.

After that, the natural oxide film of the silicon at the contact-hole area is peeled off, and an electrode 7 is created by forming a metal film and patterning it. In the present embodiment, an aluminum layer is formed by vapor deposition as the metal layer.

Then, after the natural oxide film on the reverse side of the silicon is peeled off, aluminum is vapor-deposited on the reverse side of the wafer to form an aluminum electrode 8 as shown in FIG. 4.

The region 2 in the present embodiment shown in FIGS. 4 and 6 is $n^+$-type. It is also possible to create a photodiode in which each of the polarities of the silicon wafer and the regions 1 and 2 is reversed. In this case, the ion species to be injected may be $B^+$, $Ga^+$, a cluster ion of one of these elements, or a fluoride ion or hydride ion of one of these elements, so that B or Ga will be the main impurity of the region 2.

As shown in FIG. 7, in the photodiode according to the present embodiment, the roughness of the interface between the silicon wafer 100 and the insulator layer 5 in a region having a length of 1 μm in the direction parallel to the interface corresponds to the minimal level difference of the atoms in the plane orientation of the (100) oriented plane of the silicon, i.e. 0.14 nm, which is due to the use of the smoothing process including the step of removing a natural oxide film from the surface by using a chemical solution of diluted hydrofluoric acid to make the roughness of the silicon surface correspond to the minimal level difference of the atoms on the (100) oriented plane of the silicon and the step of performing a heat treatment in a high-cleanness argon atmosphere at atmospheric pressure, as well as the use of a method for forming an insulator layer in which the obtained smoothness at the interface between the silicon and the insulator layer is maintained. It should be noted that the minimal level difference of the atoms in a certain plane orientation of a silicon means the minimal distance of the atomic planes each of which is formed by a plurality of atoms arranged parallel to that plane orientation. This distance is observed as an average of a plurality of level differences of the atomic planes on an roughness profile of a silicon observed with an atomic force microscope, a scanning tunneling microscope or a transmission electron microscope.

In the present embodiment, the thickness 10 of the non-depleted region 9 (FIG. 6) of the $n^+$-type region 2 with a thickness of 25 nm is 5 nm, which is larger than the roughness 11 of the interface and is smaller than the penetration depth 12 of the ultraviolet at which the intensity of the ultraviolet light in a wavelength range of 200-320 nm entering the silicon is equal to 1/e times the intensity of the same ultraviolet light at the outermost surface of the silicon. Therefore, a high level of sensitivity to the ultraviolet light is obtained without increasing the dark current.

As shown in FIG. 6, the non-depleted region 9 in the region 2 is entirely located below the roughness of the interface, with no local portion being thinner than the roughness of the interface. Therefore, unlike the case where a depleted region is locally formed in the $n^+$-type region 2, there is no flow of the dark current due to the fixed charges generated in the insulator layer 5 or the insulation film layer 6 as a result of long-term irradiation with the ultraviolet light, so that both the dark current and the sensitivity remain highly stable against the long-term irradiation with the ultraviolet light.

The reason why the thickness 10 of the non-depleted region 9 in the region 2 can be controlled according to the penetration depth 12 of the ultraviolet light and the roughness of the interface, as in the present invention, is because the interface between the region 2 and the insulator layer 5 is smoothed on the atomic level.

Second Embodiment

Figure 5:
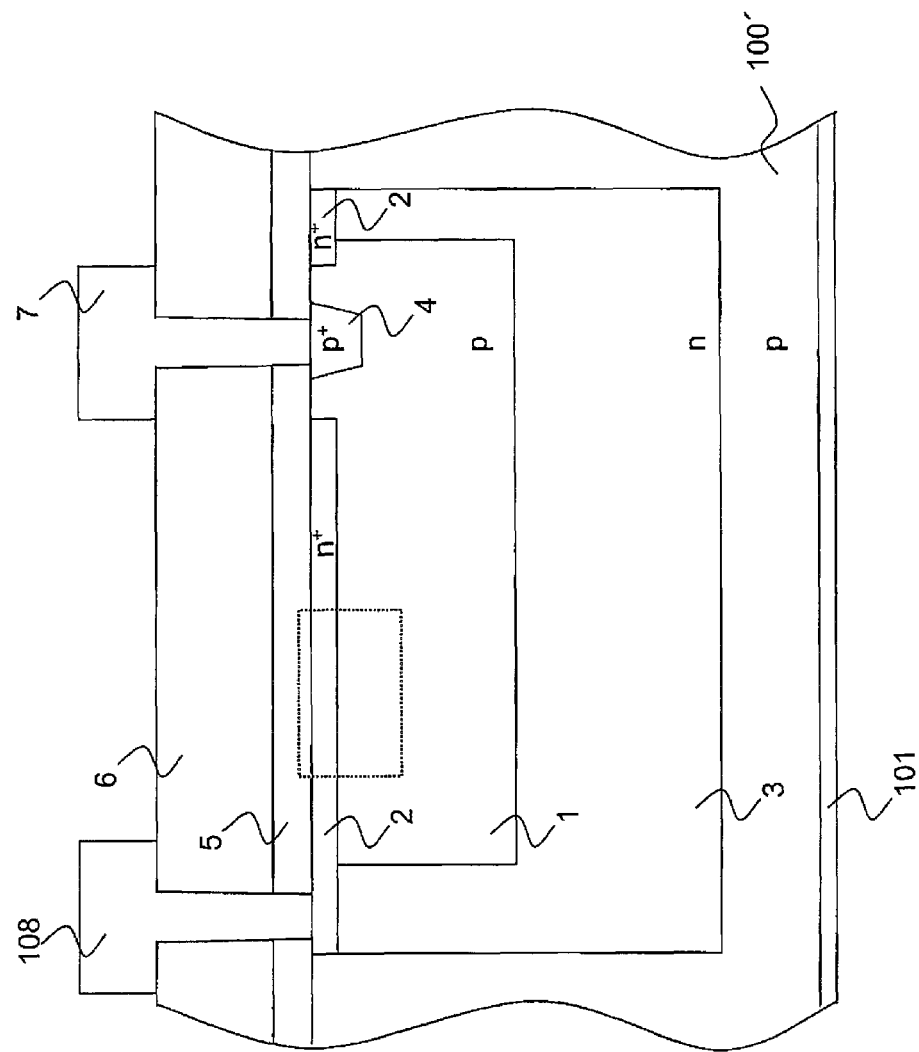
FIG. 5 is a sectional view of a photodiode according to the second embodiment of the present invention.

FIG. 5 shows a sectional view of a photodiode according to the second embodiment of the present invention, FIG. 6 is an enlarged view of a section of the sectional view of the photodiode surrounded by the dotted line in FIG. 5, and FIG. 7 is an atomic force microscope image and an roughness profile of the interface between the semiconductor layer and the insulator layer 5.

Each of the regions 1, 2, 4, 5, 6 and 7 is identical to the region denoted by the same reference number in the first embodiment.

The second embodiment differs from the first embodiment in that, before the region 1 is formed, a p-type silicon wafer 100' is used and an n-type region 3 is created in the p-type silicon wafer 100'. The n-type region 3 is formed by injecting $P^+$ ions with an energy of 250 keV and at a dose of $1.5 \times 10^{12}$ $cm^{-2}$. The n-type region 3 and the p-type region 1 may be created in reverse order.

In the present embodiment, the electrode 108 connected to the n-type region 3 via the $n^+$-type region 2 is formed by a method equivalent to the method used for forming the electrode 7.

The photodiode according to the present embodiment has the same effects as the first embodiment in terms of the sensitivity to ultraviolet light as well as the stability of the dark current and the sensitivity against long-term irradiation with the ultraviolet light.

In the present embodiment, each of the regions 2 and 3 forms a PN junction with the region 1. These PN junctions create such a wide depletion layer that can entirely deplete the p-type region 1 within a voltage range in which the photodiode is operated, so that the photocharges accumulated in the p-type region 1 can be completely transferred. Thus, an effective transfer of the photocharges is achieved.

As stated earlier, the polarity of the silicon wafer 100' in the present embodiment is p-type. Therefore, electric charges which have overflowed from the photodiode can be discharged by controlling the potential of the silicon wafer 100'. For this purpose, a control electrode 101 is provided on the bottom side of the wafer 100'. However, the polarity of the silicon wafer may be n-type.

Although the region 2 in the present embodiment is $n^+$-type, it is also possible to create a photodiode in which each of the polarities of the silicon wafer 100' and the regions 1 and 2 is reversed.

Third Embodiment

FIG. 8 shows a schematic plan view of a photodiode array according to the present embodiment.

The photodiode array includes pixels 13 arranged in the form of an array, with each pixel including at least one photodiode described in the first or second embodiment. In the present embodiment, the region 2 of the photodiode is $n^+$-type, and a p-channel transfer transistor connected to a portion of the photodiode is created in each of the pixels.

In the present embodiment, the pitch of the pixels 13 is 20 µm. The total number of the pixels 13 is 1024.

As shown, a shift register 14 is provided as a scan circuit for sequentially reading a signal from each of the pixels.

In the present embodiment, positive holes are read out as the photocharges. A device which reads out electrons as the photocharges can also be created, in which case the photodiode has a $p^+$-type region as the region 2 and an n-channel transistor is created as the transfer transistor.

In the photodiode array according to the present embodiment, the photodiode section for generating and accumulating photocharges in each pixel has the characteristics described in the first and second embodiments. Therefore, a high level of sensitivity to the light in a wavelength range of 200-1100 nm, including ultraviolet light, is obtained in any of the pixels, without increasing the dark current. Furthermore, a signal originating from light impinging on each pixel can be individually read out.

Since no local area in which the non-depleted region of the region 2 is thinner than the roughness of the interface is created by the fixed charges generated in the oxide film by a long-term irradiation with the ultraviolet light, both the dark current and the sensitivity are highly stable against the long-term irradiation with the ultraviolet light in any of the pixels.

Fourth Embodiment

FIG. 9 shows a schematic diagram of a spectrophotometer according to the fourth embodiment of the present invention.

The spectrophotometer includes a light source 15, a first lens 16, a second lens 17, a diffraction grating 18 and a photodiode array 19. It is used for performing a measurement on an object 20 to be measured. Specifically, a light source consisting of a tungsten lamp and a deuterium lamp for generating light in a wavelength range of 200-1100 nm is used as the light source 15. A light source which generates light in a wavelength range of 200-320 nm may also be used.

The first lens 16 is arranged so that the light generated by the light source 15 is focused on the measurement object 20. The light which has passed through the measurement object 20 is focused on the diffraction grating 18 via the second lens 17.

A photodiode array 19 having a structure described in the third embodiment is located at a distance from the diffraction grating 18. The photodiode array 19 is placed at such a location where the diffracted light with the wavelength range of 200-1100 nm forms a 2-cm-wide spectral image. It has a wavelength-resolving power of approximately 1 nm for the light in the wavelength range of 200-1100 nm.

In the present embodiment, the photodiode array 19 for generating and accumulating photocharges in each pixel has the characteristics described in the first and second embodiments. Therefore, a high level of sensitivity to the light in a wavelength range of 200-1100 nm, including ultraviolet light, is obtained without increasing the dark current. Furthermore, since no local area in which the non-depleted region of the region 2 is thinner than the roughness of the interface is created by the fixed charges generated in the oxide film by a long-term irradiation with the ultraviolet light, both the dark current and the sensitivity are highly stable against the long-term irradiation with the ultraviolet light.

The spectrophotometer in the present embodiment has a basic configuration. A spectrophotometer having a different configuration will also exhibit the previously described effects if the photodiode array 19 described in the third embodiment is used in the photodetector section of the spectrophotometer.

FIG. 10 shows a schematic plan view of a solid-state image sensor according to the fifth embodiment of the present invention.

The solid-state image sensor includes pixels 13 arranged in the form of a two-dimensional array, with each pixel including at least one photodiode described in the first or second embodiment. In the present embodiment, it is assumed that the region 2 of the photodiode is $n^+$-type, although the region 2 of the photodiode may be $p^+$-type.

Each of the pixels constituting the solid-state image sensor includes a transfer transistor connected to a portion of the photodiode, a floating diffusion for converting the transferred photodiodes into voltage, a source follower transistor for amplifying a voltage signal produced by the floating diffusion, a reset transistor for resetting the voltages of the floating diffusion and the photodiode, as well as a selection-switching transistor for selecting a pixel. Furthermore, as shown in FIG. 10, a horizontal shift register 21 and a vertical shift register 22 as a scan circuit for sequentially reading a signal from each pixel are provided on the periphery of the area in which the pixels are arranged.

The device described in the present embodiment is a CMOS image sensor. However, it may be configured as a CCD image sensor.

In the present embodiment, the photodiode section for generating and accumulating photocharges in each pixel has the characteristics described in the first and second embodiments. Therefore, a high level of sensitivity to the light in a wavelength range of 200-1100 nm, including ultraviolet light, is obtained in any of the pixels, without increasing the dark current. Furthermore, a signal originating from light impinging on each of the pixels arranged in the form of a two-dimensional array can be individually read out, and an image can be captured.

Since no local area in which the non-depleted region of the region 2 is thinner than the roughness of the interface is created by the fixed charges generated in the oxide film by a long-term irradiation with ultraviolet light, both the dark current and the sensitivity are highly stable against the long-term irradiation with the ultraviolet light in any of the pixels.

INDUSTRIAL APPLICABILITY

The present invention is applicable to a photodiode, a photodiode array and a method for producing a photodiode, as well as a spectrophotometer or solid-state imaging system using a photodiode array. It can also be applied in an ultraviolet meter for monitoring the intensity of an ultraviolet light used in a stepper motor or scanner or that of an ultraviolet light for a high-performance liquid chromatograph, an ICP emission spectrophotometer, a Raman spectrophotometer, an in-vivo optical imaging system, a high-speed video camera, or other types of optical sensors which should desirably have high sensitivity to light including ultraviolet.

EXPLANATION OF NUMERALS

1 . . . p-Type Region
2 . . . $n^+$-Type Region
3 . . . n-Type Region
4 . . . $p^+$-Type Region
5 . . . Insulator Layer
6 . . . Insulation Film Layer
7 . . . Aluminum Electrode for $p^+$-Type Region
8 . . . Aluminum Electrode for $n^+$-Type Region
9 . . . Non-Depleted Region in $n^+$-Type Region
10 . . . Thickness of Non-Depleted Region in $n^+$-Type Region
11 . . . Roughness of Interface Between Silicon and Insulator Layer
12 . . . Penetration Depth of Ultraviolet Light in Silicon
13 . . . Pixel
14 . . . Shift Register
15 . . . Light Source
16 . . . First Lens
17 . . . Second Lens
18 . . . Diffraction Grating
19 . . . Photodiode Array
20 . . . Measurement Object
21 . . . Horizontal Shift Register
22 . . . Vertical Shift Register
100, 100' . . . Silicon Wafer
101 . . . Control Electrode
108 . . . Electrode

The invention claimed is:

1. A photodiode, comprising:
 a first-conduction-type region in a semiconductor layer made of silicon;
 an insulator layer being in contact with the semiconductor layer; and
 a second-conduction-type region located between the first-conduction-type layer and an interface between the semiconductor layer and the insulator layer, the second-conduction-type region having a polarity opposite to the first-conduction-type region,
 wherein a thickness of a non-depleted region of the second-conduction-type region is larger than roughness of the interface between the semiconductor layer and the insulator layer in a region having a length of 1 μm in a direction parallel to the interface, and is smaller than a penetration depth of ultraviolet light at which an intensity of the ultraviolet light in a wavelength range of 200-320 nm entering the semiconductor layer is equal to 1/e times the intensity of the same ultraviolet light at an outermost surface of the silicon.

2. The photodiode according to claim 1, comprising a third-conduction-type region being in contact with the first-conduction-type region on an opposite side of the first-conduction-type region from the second-conduction-type region, the third-conduction-type region having a polarity opposite to the first-conduction-type region.

3. The photodiode according to claim 1, wherein the roughness of the interface correspond to a minimal level difference of atoms in a plane orientation of the semiconductor layer.

4. The photodiode according to claim 1, wherein a main impurity in the second-conduction-type region is As, P or Sb.

5. The photodiode according to claim 1, wherein a main impurity in the second-conduction-type region is B or Ga.

6. A method for producing a photodiode, comprising steps of:
   forming a first-conduction-type region in a semiconductor layer made of silicon;
   forming an insulator region being in contact with the semiconductor layer; and
   forming a second-conduction-type region located between the first-conduction-type layer and an interface between the semiconductor layer and the insulator layer, the second-conduction-type region having a polarity opposite to the first-conduction-type region,
   wherein a smoothing process for making roughness of a surface of the semiconductor layer correspond to a minimal level difference of atoms in a plane orientation of the semiconductor layer is performed at least one time in a production process.

7. The method for producing a photodiode according to claim 6, wherein the smoothing process includes a process of removing a natural oxide film on the surface of the semiconductor layer and then heat-treating the semiconductor layer at 800° C. or higher temperatures in an atmosphere of Ar, $H_2$ or Ar/$H_2$.

8. The method for producing a photodiode according to claim 6, further comprising a film-forming process for creating the interface between the semiconductor layer and the insulator layer by forming the insulator layer by an oxidizing, oxynitriding or nitriding method in which the created interface has roughness that correspond to the minimal level difference of the atoms in the plane orientation of the semiconductor layer if the roughness on the surface of the semiconductor layer before the formation of the insulator layer correspond to the minimal level difference of the atoms in the plane orientation of the semiconductor layer.

9. The method for producing a photodiode according to claim 6, further comprising a film-forming process for forming the insulator layer by oxidizing, oxynitriding or nitriding the surface of the semiconductor layer by an isotropic process whose film-forming rate is independent of the difference in the plane orientation of the semiconductor layer.

10. A photodiode array for receiving a component of light in a wavelength range of 200-1100 nm, with a plurality of pixels integrated in a form of an array, each pixel having the photodiode according to claim 1, and the photodiode array comprising:
    a scan circuit or a charge-signal transfer circuit for sequentially selecting and reading a signal from each pixel.

11. A spectrophotometer for performing a spectral measurement of at least a portion of light in a wavelength range of 200-1100 nm, including:
    the photodiode array according to claim 10;
    a light source for generating light in a wavelength range of 200-1100 nm;
    a first lens for focusing the light generated by the light source on a measurement object;
    a second lens for focusing the light transmitted through the measurement object; and
    either a diffraction grating or a prism.

12. A solid-state imaging system for receiving a component of light in a wavelength range of 200-1100 nm, comprising a plurality of pixels integrated in a form of an array, each pixel having the photodiode according to claim 1.

13. A photodiode including an insulator layer and one conduction-type region being in contact with the insulator layer, with a non-depleted region formed at an interface between the one conduction-type region and the insulator layer, wherein:
    the non-depleted region has a thickness corresponding to a height of roughness of the interface and a penetration depth of ultraviolet light, and
    the thickness of the non-depleted region is larger than the roughness of the interface and is smaller than the penetration depth of the ultraviolet light.

* * * * *